US011526827B2

(12) United States Patent
Li et al.

(10) Patent No.: US 11,526,827 B2
(45) Date of Patent: Dec. 13, 2022

(54) NON-INTRUSIVE WORKFLOW ASSESSMENT (NIWA) FOR MANUFACTURING OPTIMIZATION

(71) Applicant: THE REGENTS OF THE UNIVERSITY OF CALIFORNIA, Oakland, CA (US)

(72) Inventors: Guann-Pyng Li, Irvine, CA (US); Michael John Klopfer, Irvine, CA (US); Sergio Gago-Masague, Irvine, CA (US); Richard P. Donovan, Irvine, CA (US); Yutian Ren, Irvine, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 693 days.

(21) Appl. No.: 16/588,634

(22) Filed: Sep. 30, 2019

(65) Prior Publication Data
US 2020/0104779 A1 Apr. 2, 2020

Related U.S. Application Data

(60) Provisional application No. 62/738,396, filed on Sep. 28, 2018.

(51) Int. Cl.
| | |
|---|---|
| *G06Q 10/06* | (2012.01) |
| *G06Q 50/06* | (2012.01) |
| *G06Q 50/04* | (2012.01) |
| *G05B 23/02* | (2006.01) |
| *G01R 22/10* | (2006.01) |

(52) U.S. Cl.
CPC ....... *G06Q 10/06398* (2013.01); *G01R 22/10* (2013.01); *G05B 23/0216* (2013.01); *G06Q 50/04* (2013.01); *G06Q 50/06* (2013.01)

(58) Field of Classification Search
CPC .. G06Q 10/06398; G06Q 50/04; G06Q 50/06; G01R 22/10; G05B 23/0216
See application file for complete search history.

(56) References Cited

U.S. PATENT DOCUMENTS

| | | |
|---|---|---|
| 4,848,141 A | 7/1989 | Warren et al. |
| 4,858,141 A | 8/1989 | Hart et al. |
| 8,812,427 B2 | 8/2014 | Kim et al. |
| 9,104,189 B2 | 8/2015 | Berges Gonzalez et al. |
| (Continued) | | |

FOREIGN PATENT DOCUMENTS

WO 2013163460 A1 10/2013

OTHER PUBLICATIONS

Zhang et al., A Review on Human Activity Recognition Using, Feb. 22, 2017, Vision-Based Method, College of Information Science and Engineering, Ocean University of China, Qingdao et al., p. 1-31. (Year: 2017).*

(Continued)

*Primary Examiner* — Kidest Bahta
(74) *Attorney, Agent, or Firm* — Nguyen Tarbet LLC

(57) ABSTRACT

Non-intrusive monitoring and workflow assessment to optimize manufacturing environments are described herein. The systems and method combines computer vision and energy load disaggregation to track worker activity and equipment usage and status. These events are then correlated to optimize workflows and energy efficiency.

20 Claims, 5 Drawing Sheets

(56) References Cited

U.S. PATENT DOCUMENTS

2014/0129162 A1* 5/2014 Hallman ................ H04L 67/12
702/63
2015/0012147 A1   1/2015 Haghighat-Kashani et al.
2015/0142695 A1   5/2015 He et al.

OTHER PUBLICATIONS

Bonfigli et al., Denoising Autoencoders for Non-lntrusive Load Monitoring: Improvements and Comparative Evaluation, Nov. 2017, Universita Politecnica delle Marche, p. 1-30. (Year: 2017).*
Le et al., Classification of energy consumption patterns for energy audit and machine scheduling in industrial manufacturing systems, 2013, Transactions of the Institute of Measurement and Control , p. 583-592. (Year: 2013).*
Veres et al. , Automatic Workflow Monitoring in Industrial Environments, 05/062010, University of Southampton, IT Innovation Centre, UK, pp. 1-13. (Year: 2010).*

* cited by examiner

NON-INTRUSIVE WORKFLOW ASSESSMENT (NIWA) FOR MANUFACTURING OPTIMIZATION

CROSS-REFERENCES TO RELATED APPLICATIONS

This application is a non-provisional and claims benefit of U.S. Provisional Application No. 62/738,396 filed Sep. 28, 2018, the specification(s) of which is/are incorporated herein in their entirety by reference.

FIELD OF THE INVENTION

The present invention relates to a platform for workflow assessment by non-intrusive monitoring combining computer vision and energy load disaggregation.

BACKGROUND OF THE INVENTION

Equipment and machine prognosis and operational health monitoring have long been an issue against energy and production efficiency in small and medium factories around the country. These inefficiencies are highly impacted by workers' skills and workflow within the already established manufacturing processes. Small and medium factories have comparably low automated level and machines are less well-maintained as compared to bigger factories. Traditional solutions for this problem usually require the installation of several sensor systems. Different machines may require different sets of sensors. This presents prohibitive cost of installation and maintenance for most factories. Hence, there is a need for a solution describing low-cost non-intrusive load monitoring (NILM) systems that can perform assessment or audit of factories workflow.

Some researchers supported the idea of combining different probabilistic functions to improve the identification of residential energy loads at home. However, those solutions cannot be applied to manufacturing environments to assess efficiency of workflows. The following patents describe other applications in non-intrusive load monitoring. U.S. Pat. No. 4,848,141 discloses a non-intrusive monitor of energy consumption of residential appliances in which sensors, coupled to the power circuits entering a residence, supply analog voltage and current signals which are converted to digital format and processed to detect changes in certain residential load parameters, i.e., admittance. Cluster analysis techniques are employed to group change measurements into certain categories, and logic is applied to identify individual appliances and the energy consumed by each.

US20150012147A1 describes a method and system for use in creating a profile of, managing and understanding power consumption in a premise of a user, wherein said premise comprises two or more power consuming devices comprises measuring, via at least one sensor, aggregate energy consumption at the premise, receiving at a mobile computing device comprising a data processor, said aggregated signal from the sensor, collecting and recording the aggregate signal over a plurality of time resolutions and frequencies, therein to create a predicted aggregate signal for each time x and frequency y, detecting changes in the predicted aggregate signal at time x and frequency y (detected consumption pattern changes) and conveying to at least one of the user, a utility company, and other third party a notification of detected consumption pattern changes.

U.S. Pat. No. 8,812,427B2 teaches a disaggregating power load method comprising receiving time series data representing total energy consumption; identifying distinguishing features in the time series data; and identifying energy consumption constituents of the total energy consumption based on the features. U.S. Pat. No. 9,104,189B2 describes an apparatus and method including acquiring a signal indicative of power consumption; detecting a transient in the signal; extracting a feature indicative of the transient, wherein extracting the feature includes: fitting a plurality of models to the transient, selecting one of the plurality of models as a model for the transient, and defining the feature indicative of the transient based on at least one parameter of the model for the transient; and classifying the transient based on the feature. Additional non-intrusive appliance load monitoring techniques for performing energy disaggregation of a whole-house energy usage profile is disclosed in US20150142695 and WO2013163460A1.

SUMMARY OF THE INVENTION

It is an objective of the present invention to provide a low-cost solution to help in monitoring machines and workflow from a perspective of efficiency, efficiency, as specified in the independent claims. Embodiments of the invention are given in the dependent claims. Embodiments of the present invention can be freely combined with each other if they are not mutually exclusive.

In some aspects, the present invention features a Non-intrusive Workflow Assessment (NIWA) that utilizes computer/thermal visualization tools (e.g. security cameras) and environmental monitors such as sound, light, motion, and advance metering infrastructure already provided by utility companies (e.g. electrical smart-meters) for collecting and processing real-time data in manufacturing environments. Without wishing to limit the invention to any theory or mechanism, the inference of this data advantageously allows for modeling of learning processes that enables the assessment and optimization of workflow and energy/materials usage associated with equipment and human factors. By using imaging classifications of workers' activities and traffic trajectory inside the facility, it is possible to identify the states of equipment usage and tasks in workflow carried out by workers.

In other aspects, a system identifying correlation between the states of equipment/workflow and smart meter data enables workers and supervisors to gain insight about the energy footprint of equipment and workflow activities. The system can learn from usage patterns and self-adjust to improve operation over time. The utilization of continuous streaming meter data and manufacturing operation insight can result in factory operation optimization for energy efficiency and dynamic scheduling of equipment use for lowering a bill of material (energy) cost in a multi-tier billing program and/or a time of use billing program administrated by utilities. Such a coordinated data acquisition system from visualization and meter is a critical IT infrastructure for small and medium factories to keep affordability and easy deployment in favor of efficiency. Utility smart meter data can be augmented by branch meter and machine usage self-reporting to improve general prediction acuity. None of the presently known prior references or work has the unique inventive technical feature of the present invention.

Further still, the present invention is counterintuitive to the current prior art. A manufacturing system can be considered to be a system of systems that is configured to process material inputs into products via transformations that consume energy at the subsystem level and for accounting purposes embody that energy in the final product at the system level. Current prior art teaches that this system of systems does not include human agents as a subsystem that impacts the energy embodied in the final product. Contrary to the prior arts, the present invention connects human agents as a subsystem into this system of systems for the purpose of incorporating the workflow of these agents into the design, operation and resource (e.g. electricity, water, gas, ore, etc.) optimization of the manufacturing system.

In a non-limiting embodiment, a NIWA system of the present invention can monitor a manufacturing environment that employs a plurality of utilities. In one embodiment, the NIWA system may comprise a communications network, a visible light camera operatively coupled to the communications network, an infrared (IR) camera operatively coupled to the communications network, a smart energy meter for each utility configured to measure usage of said utility and operatively coupled to the communications network, a processor operatively coupled to the communications network, and a memory operatively coupled to the processor. The memory can store instructions that, when executed by the processor, causes the processor to perform operations. In some embodiments, the NIWA system may be implemented in a method that perform the operations comprising obtaining images of the manufacturing environment collected over a time series, such as 2-10 second intervals, by the visible light camera, obtaining a temperature data of the manufacturing environment collected over the time series by the IR camera, for each utility, obtaining utility meter data collected over the time series from the smart energy meter, correlating the images, temperature data, and utility meter data, classifying a workflow activity of a worker and energy consumption of a machine in the manufacturing environment based on the correlation, and determining a status of the workflow activity and a status of the machine usage based on the correlation in real time. In further embodiments, the method may include identifying sources of potential inefficiencies or leakages in the workflow activity and energy consumption based at least in part on the workflow assessment, and suggesting improvements to workflow activity and machine usage corresponding to the identified sources.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

BRIEF DESCRIPTION OF THE DRAWINGS

The features and advantages of the present invention will become apparent from a consideration of the following detailed description presented in connection with the accompanying drawings in which.

DESCRIPTION OF PREFERRED EMBODIMENTS

Referring to FIGS. 1-4, the present invention may feature a non-intrusive method for monitoring a manufacturing environment that employs a plurality of utilities. In some embodiments, the utilities may comprise electricity, water, and gas. The method can be carried out by instructions stored on a non-transient computer-readable medium and executed by a processor. In some embodiments, the method may comprise obtaining images of the manufacturing environment collected over a time series by a visible light camera, obtaining utility meter data for each utility collected over the time series from a smart energy meter that measures usage of said utility, and correlating the images and utility meter data in order to classify a workflow activity of a worker and energy consumption of a machine in the manufacturing environment and determine a status of the workflow activity and a status of the machine usage in real time. In some embodiments, the utility meter data may be a time series history of the aggregate power consumption of the manufacturing environment. In other embodiments, the time series may comprise a plurality of times separated by 2-10 second intervals. For example, the time interval may be 5 seconds.

In some embodiments, the images are used to detect the worker in the scene with histogram of oriented gradients (HOG) descriptor and measure machine occupancy present in the manufacturing environment. In some embodiments, the images may comprise a frame capture of the worker. Body movement information may be extracted from the image capture to form a classification of machine usage activated by the worker, which can serve as a trigger event for syncing with smart meter data. In some embodiments, information from the images is pre-processed using Open Computer Vision (OpenCV).

In further embodiments, the method may include obtaining temperature data of the manufacturing environment collected over the time series by a temperature sensor, such as an infrared camera, thermometer, or thermocouple. The temperature data may be used to confirm the classification of workflow activity of the worker and energy consumption of the machine in the manufacturing environment. In a non-limiting embodiment, the temperature sensor may be the IR camera. The temperature data is obtained by using a temperature-controller load source and calibrating the mapping temperature at each pixel from raw IR images.

In some embodiments, the visible light and IR cameras are operatively connected to single-board computer, which is used for preprocessing to classify the workflow and machine activities. The single-board computer may be a Raspberry Pi. In other embodiments, the utility meter data is obtained through a network. The network may be Wi-Fi, Zigbee, or a network of cellular infrastructures.

Figure 4A:
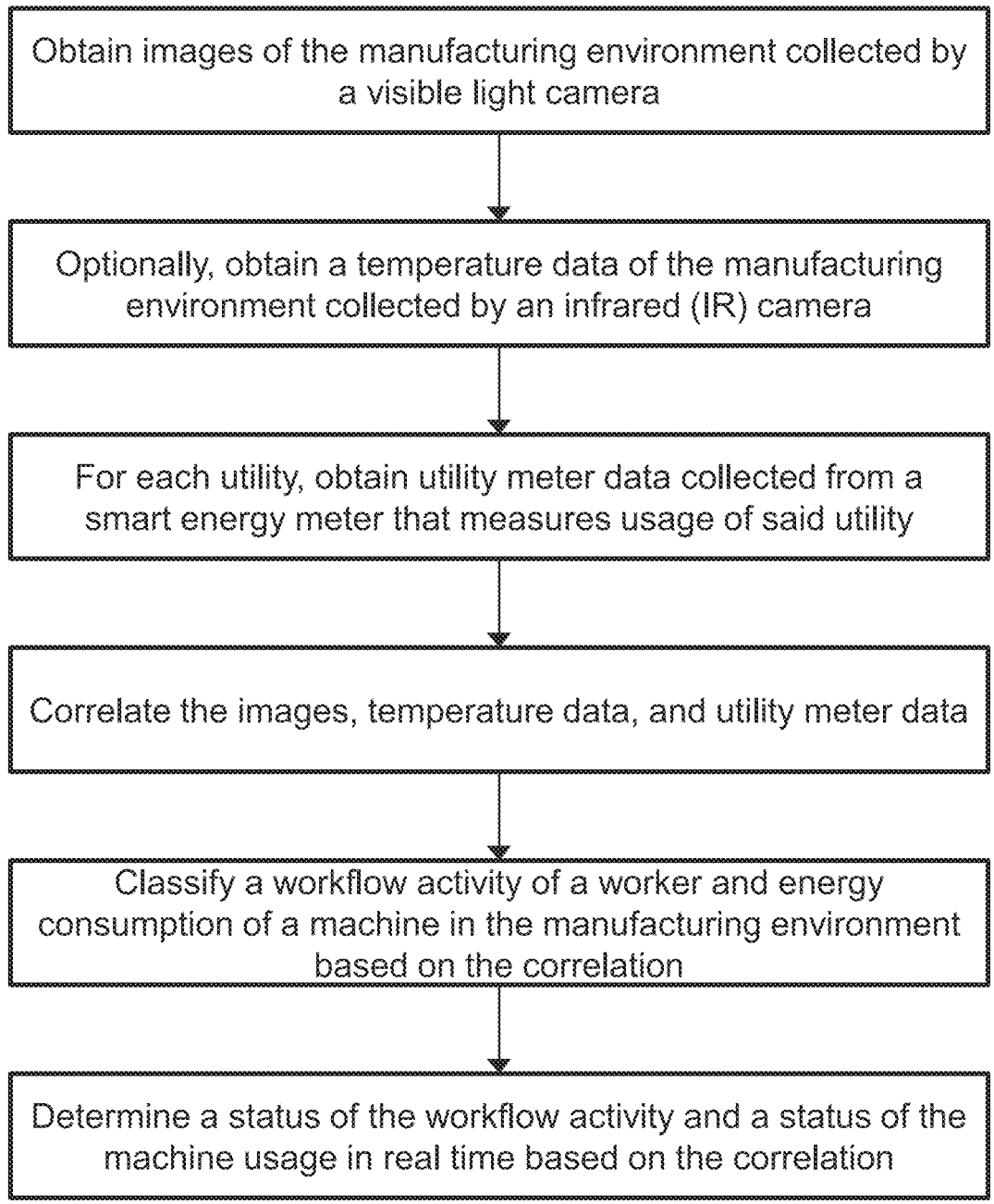
FIG. 4A shows a non-limiting embodiment of a method of the present invention.
Figure 4B:
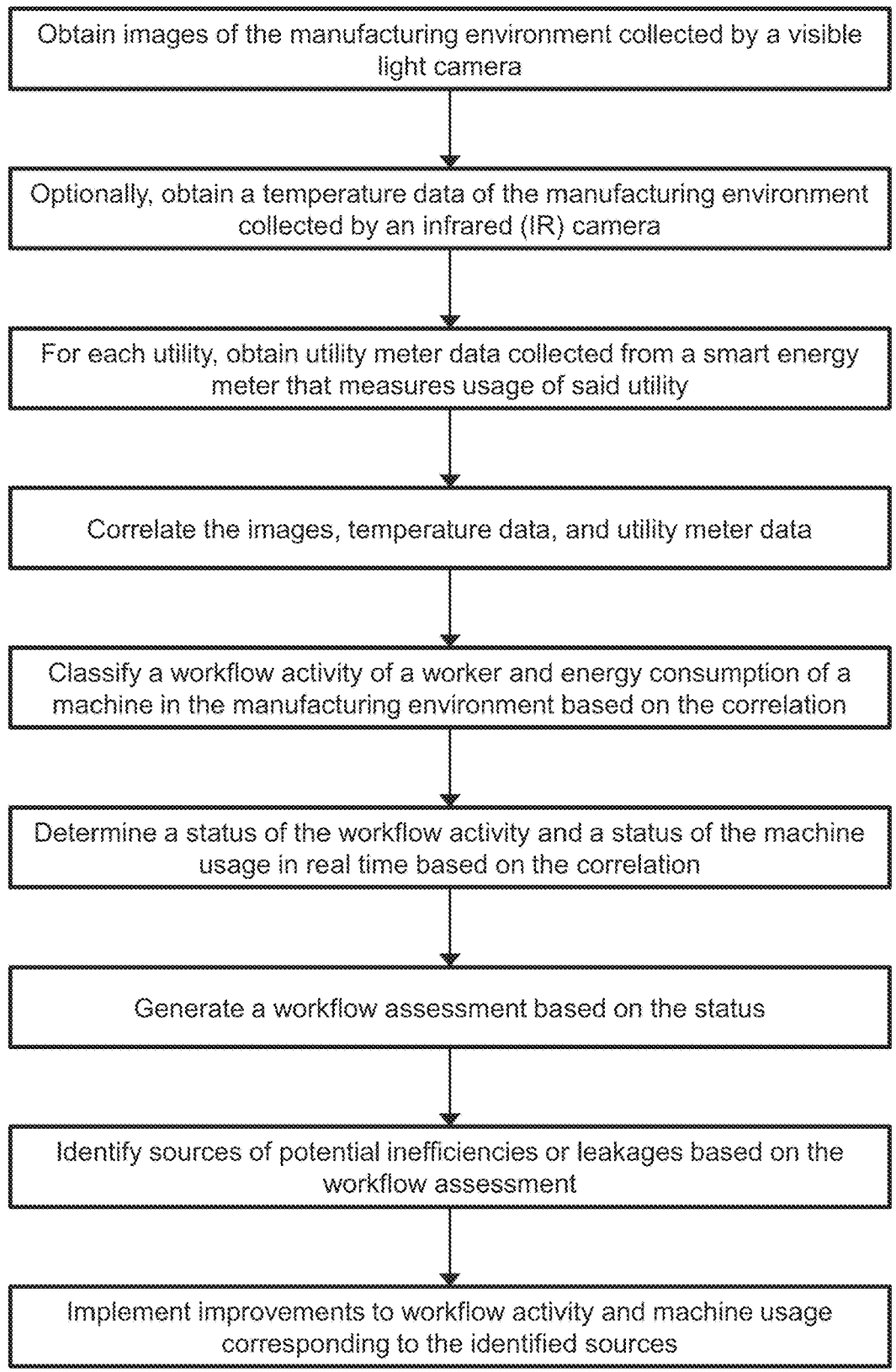
FIG. 4B shows another embodiment of a method of the present invention.

According to another embodiment, the present invention may feature a non-intrusive method for assessing and optimizing a manufacturing environment that employs a plurality of utilities as shown in FIG. 4B. The method may be carried out by instructions stored on a non-transient computer-readable medium and executed by a processor. In one embodiment, the method may comprise obtaining images of the manufacturing environment collected over a plurality of times by a visible light camera, obtaining utility meter data for each utility collected over the plurality of times from a smart energy meter that measures usage of said utility, correlating the images and utility meter data in order to classify a workflow activity of a worker and energy consumption of a machine in the manufacturing environment and determine a status of the workflow activity and a status of the machine usage in real time, thereby generating a workflow assessment, identifying sources of potential inefficiencies or leakages in the workflow activity and energy consumption based at least in part on the workflow assessment, and implementing improvements to workflow activity and machine usage corresponding to the identified sources, thereby optimizing workflows and energy efficiency. In some embodiments, the correlation of workflow activity of a worker and energy consumption may be confirmed by obtaining temperature data of the manufacturing environment collected over the plurality of times by a temperature sensor.

Figure 1:
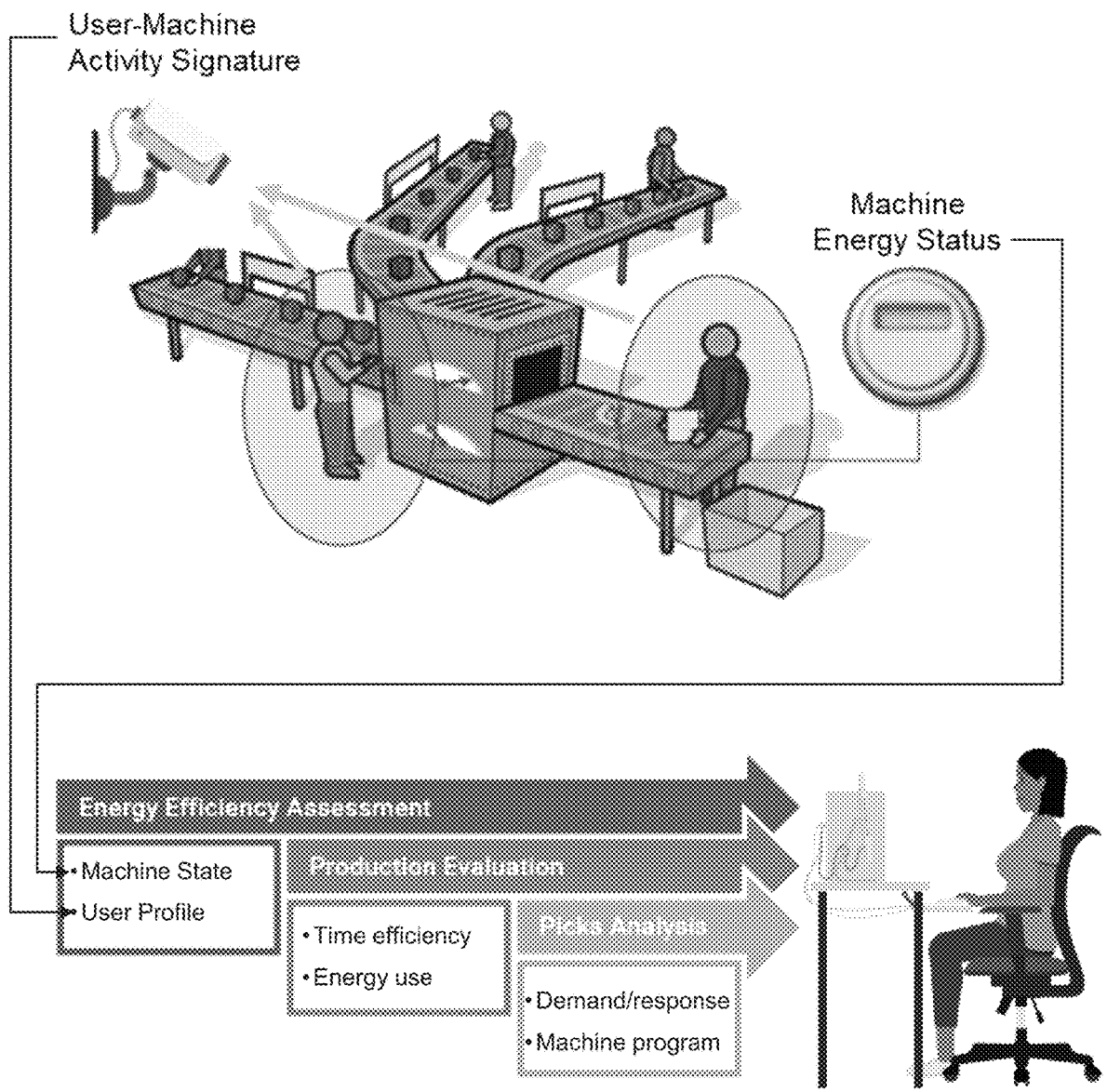
FIG. 1 shows a non-limiting embodiment of a monitoring system of the present invention in a manufacturing environment.
Figure 2:
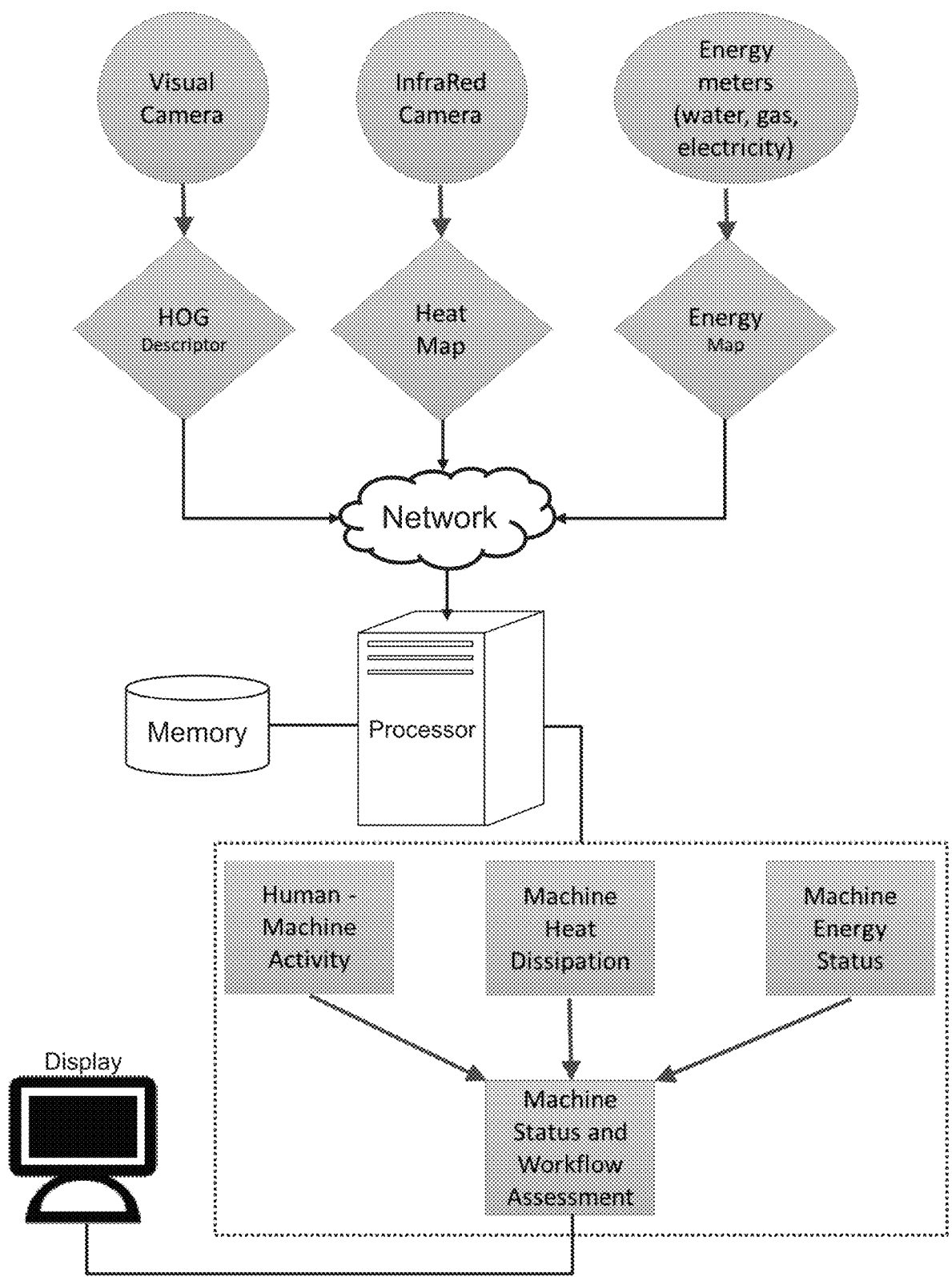
FIG. 2 is an example of the monitoring system architecture according to one embodiment of the present invention.

According to yet another embodiment, the present invention may feature a non-intrusive system for monitoring a manufacturing environment that employs a plurality of utilities as shown in FIGS. 1-2. In one embodiment, the system may comprise a communications network, a visible light camera operatively coupled to the communications network, a smart energy meter for each utility configured to measure usage of said utility and operatively coupled to the communications network, a processor operatively coupled to the communications network, and a memory operatively coupled to the processor. The memory can store instructions that, when executed by the processor, causes the processor to perform operations. In some embodiments, the operations may comprise obtaining images of the manufacturing environment collected over a time series, such as 2-10 second intervals, by the visible light camera, obtaining utility meter data collected over the time series from the smart energy meter for each utility, and correlating the images and utility meter data to classify a workflow activity of a worker and energy consumption of a machine in the manufacturing environment based on the correlation, and determine the status of the workflow activity and machine usage based on the correlation in real time.

In other embodiments, the system may further include a temperature sensor, such as an infrared (IR) camera, thermometer, or thermocouple, operatively coupled to the communications network. The temperature sensor is used to obtain temperature data of the manufacturing environment collected over the time series, and said temperature data can confirm the correlation of workflow activity and machine usage.

In further embodiments, the memory can store additional instructions for optimizing the manufacturing environment. When executed by the processor, these additional instructions can cause the processor to perform operations comprising identifying sources of potential inefficiencies or leakages in the workflow activity and energy consumption based at least in part on the workflow assessment, and suggesting improvements to workflow activity and machine usage corresponding to the identified sources.

In some preferred embodiments, the present invention features a Non-intrusive Workflow Assessment (NIWA) that may comprise two major sub-platforms; (1) a platform for data acquisition, and (2) a platform for data processing and visualization.

1. NIWA's Data Acquisition Platform

To meet the requirements of NIWA, the energy aggregated data is collected and analyzed from the utility's smart-meters such as electricity, gas and water, and individual meters, self-reporting to augment and improve disaggregation. Visual cameras, such as visible wavelength and optionally, infrared, are used as vision monitors of the manufacturing environment. The energy aggregated data from the smart-meter can be complemented with a specific plug-meter installed in key locations and/or machines to provide a better data resolution to perform non-intrusive load monitoring (NILM) based upon energy disaggregation. The number of additional plug meters needed depends on the temporal resolution requirement in machine automation and control for manufacturing. The metering system provides measures of water, gas and electricity, such as fluid flow, instant voltage, current, power demand and power factor of the machines present in the environment.

Regarding the cameras, a commercial smart pixel array camera used in smartphones, a conventional visible wavelength camera, or both may be used to capture worker activities. The output of any of the vision cameras can be combined with an infrared (IR) camera to determine the state of machine. Instead of a full image, frame capture of a human may be used for extracting workers' hand and foot movement to form a classification of machine usage activated by workers, which can serve as a trigger event for sync with smart meter data. This visual information is pre-processed on the edge using OpenCV.

In some embodiments, the data acquisition platform can use Wi-Fi and Zigbee (or a cellular infrastructure) to collect information from the energy meters installed by utilities such as water, gas and electricity, and the vision and IR cameras, which can be built in a circuit board format connected to a Raspberry Pi, which is used as sensor data edge preprocessing for determining the classifications of machine/worker activities. Finally, in the data acquisition platform, a rainforest USG-Zigbee converter may be added to the Pi preprocessing local server to collect the data from the utility's smart-meter. The Zigbee component may be replaced by a Wi-Fi enabled Itron OpenWay Riva 'Smart' Meters. A cellular based infrastructure such as 4G LTE or 5G can be used in support of the data acquisition platform.

2. NIWA's Data Processing and Visualization Platform

NIWA's platform processes three types of sensor input and correlates this data (e.g. imaging, temperature, and energy data) to provide precise information on the status of both machines and worker activities in manufacturing workflow. The infrared camera provides the system with a temperature map of the environment by using a temperature-controller load source and calibrating the mapping temperature at each pixel from raw IR images. In addition, visible wavelength and/or commercial smart pixel array cameras provide an image from the environment to help to understand the scene being monitored. This reading is also used to detect people in the scene with histogram of oriented gradients (HOG) descriptor and measure the occupancy of equipment present in the environment. Combined with the IR image, a highly accurate approximation about the usage status of each machine can be created in real time. This sensor data may be used to classify human-machine activity and its associated energy consumption, which is done by correlating the activity with energy data from the metering system. The correlation of the visual and metering data allows determination of any potential inefficiencies or leakages in the system.

The aggregated power consumption information collected from the advanced smart metering infrastructure with a 5 second sampling rate allows enough resolution to perform energy disaggregation in most environments with the help of the collected vision data. In large facilities with an elevated number of machines, an additional capability of the proposed system that allows inclusion of additional number and location of plug meters can provide the resolution needed for energy disaggregation beyond 5 seconds from the smart meter.

Energy disaggregation is performed by machine learning on the power factors and energy consumption signatures produced by different combinations of equipment usage. The machine-learned model can map aggregated power demand and power factor into the usage status of each machine. Fusion technologies, such as Dempster, can help with using computer/thermal vision to include in load disaggregation techniques. This makes the system cost-effective compared to collecting each machine's energy consumption directly. The extracted energy signatures for machine/worker activities (from sensor data to contexture information) can be used to optimize or design manufacturing workflow for energy productivity. In addition, the desegregated load energy information can be used as part of equipment and machine prognosis and operational health monitoring for decision making support in machine maintenance.

A differentiating point of the presented platform compared with other inventions in the field targeting energy disaggregation is being extremely affordable and non-intrusive, given that the platform uses the infrastructures and equipment (smart-meter and cameras) that are already available in most manufacturing environments. It is also significantly more precise as the invention uses vision data to track equipment usage and status. The inventors have not found any previous applications targeting the correlation of these events to track manufacturing environments to optimize workflows and energy efficiency.

Without wishing to limit the present invention, it is believed that the present system and application presents a high value proposition that can empower workers with actionable intelligence to contribute to decision making for energy savings, demand side energy management for reducing operation cost, waste stream reduction, environmental impacts minimization, and improved energy productivity for healthy safe accessible manufacturing environments.

Figure 3:
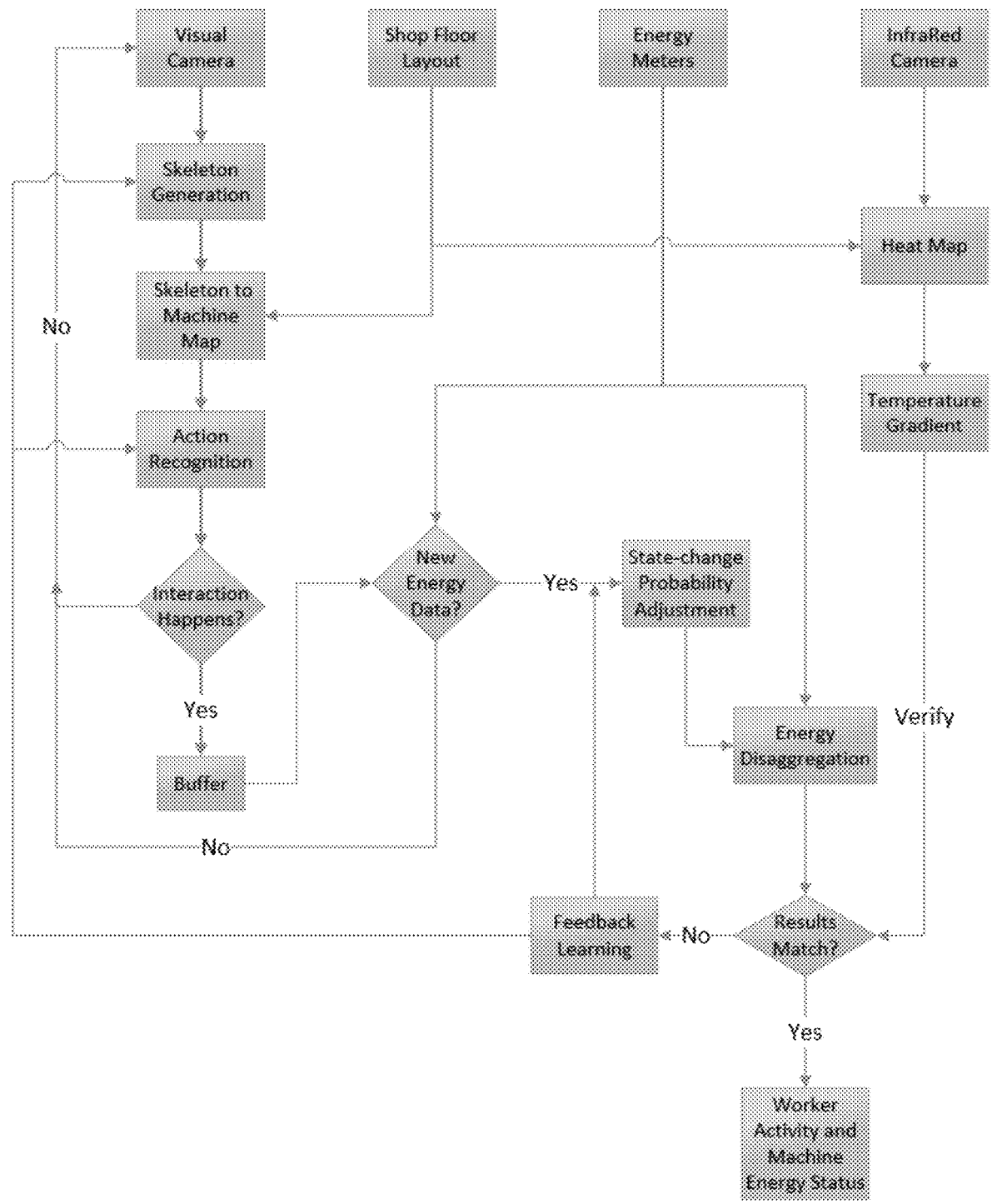
FIG. 3 shows a process flow diagram of the monitoring system.

Referring to FIG. 3, a process flow of the NIWA system operates as follows. A Skeleton Generation module processes an image of multiple workers and generates a skeleton representation of each worker. This representation comprises key points in a body (e.g. head, shoulder and elbows) and the connections between them. A Skeleton to Machine Map module maps the skeletons of each worker to the corresponding machine based upon prior information of a specified shop floor layout. In this fashion, a worker (or collection of workers) is specifically correlated in time and space to a corresponding machine in order to abstract the interaction for classification. An Action Recognition module classifies the skeleton features (e.g. relative position of hands to head) of the correlated skeletal representation/machine into specific human-machine interactions. The interactions may be operating the switch or control panel, touch and inspect the machine, and move the material. Depending upon the context, the algorithm of this module may be Support Vector Machines (SVM), Convolution Neural Networks (CNN), or Graph Neural Networks (GNN). An Interaction Happen module determines whether interactions happen between machine and worker, and stores trigger signals generated by interaction information to the buffer in order to sync with the energy meter data. If there is no detected interaction, the algorithm acquires the next image.

In the State Change Probability module, when there is new data from energy meters, the trigger signals are sent to adjust the state-change probability used in the energy disaggregation module. The state-change probability is a matrix indicating the correlation factor between each machine and corresponding worker-machine interaction. For example, the interaction of operating the switch and control panel will generate the higher state-change probability and input to the Energy Disaggregation Module. An energy disaggregation module classifies the aggregated energy usage signals into the energy usage of individual machines and determines the individual machine state by using the parameters of the state-change probability. The algorithm of this module may be Factorial Hidden Markov Models (FHMM) or similar mathematical probability models.

In parallel with the other process data (e.g. energy meters, shop floor layout, and visual cameras), an infrared camera outputs a heat map. The Temperature Gradient module then calculates the temperature gradient of each machine with respect to its previous temperature and ambient temperature. This serves as a lagging confirmation to verify the determination of machine states since at different states, the machine dissipates different heat. A Results Match module evaluates the correlation between IR information and worker-machine interaction to exam the consistency of the results. If there is error in machine state determination, errors will be passed into a Feedback Learning module to adjust the correlation factor (state-change probability) as well as neural network parameters in the next detection cycle. The Feedback Learning module uses the error results verified by the IR information as the labels to train the Action Recognition module and Energy Disaggregation module through back propagation. This module is able to achieve adaptive learning in an unsupervised way. The algorithm of this module may be reinforcement learning. For example, the Feedback Learning module processes the errors by labeling the action recognition results as negative samples. Then the negative samples back propagates to the Action Recognition module and fine-tune the parameters of these neural networks in order to learn from the real manufacturing environments.

Example

The following is a non-limiting example of the present invention. It is to be understood that said example is not intended to limit the present invention in any way. Equivalents or substitutes are within the scope of the present invention.

A small factory in California is implementing the present invention. On a Sunday when there are no workers in the factory, calibration procedures are performed to obtain the machine profile of 5 machines. Infrared cameras are installed and the temperature profiles of 5 machines are collected in their ON state, OFF state, and STAND-BY. The energy consumption of each machine is also calculated in its ON state, OFF state, and STAND-BY. The temperature profiles and energy consumption of the machines make up the machine profile. On Monday, when the workers are in the factory, a video camera focused on each machine captures images of the workers' interactions with the machines. The smart utility meter measures the aggregate energy consumption of the 5 machines. The present invention can determine the status of each machines based on the images of the workers' gestures, e.g. when the machine is turned on, on stand-by, or turned off by the worker. Based on the machine status, energy consumption of each machine can be calculated. To verify that the machine status corresponds to the workers' interactions with the machine, the infrared camera records the temperature profile of the machine. The temperature profile is correlated to the machine status.

By determining the energy consumption of each machine, energy and work efficiency can be improved. For example, if the machine is typically place on stand-by for a long period of time, the worker may be advised to shut the machine off. As another example, instead of shutting a machine off, the machine can be placed on stand-by for a short period of time if another worker will be using the machine, e.g. shift change.

As used herein, the term "about" refers to plus or minus 10% of the referenced number.

Various modifications of the invention, in addition to those described herein, will be apparent to those skilled in the art from the foregoing description. Such modifications are also intended to fall within the scope of the appended claims. Each reference cited in the present application is incorporated herein by reference in its entirety. Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

Although there has been shown and described the preferred embodiment of the present invention, it will be readily apparent to those skilled in the art that modifications may be made thereto which do not exceed the scope of the appended claims. Therefore, the scope of the invention is only to be limited by the following claims. Reference numbers recited in the claims are exemplary and for ease of review by the patent office only, and are not limiting in any way. In some embodiments, the figures presented in this patent application are drawn to scale, including the angles, ratios of dimensions, etc. In some embodiments, the figures are representative only and the claims are not limited by the dimensions of the figures. In some embodiments, descriptions of the inventions described herein using the phrase "comprising" includes embodiments that could be described as "consisting of", and as such the written description requirement for claiming one or more embodiments of the present invention using the phrase "consisting of" is met.

What is claimed is:

1. A non-intrusive method for monitoring a manufacturing environment, wherein the manufacturing environment employs a plurality of utilities, wherein the method is carried out by instructions stored on a non-transient computer-readable medium and executed by a processor, wherein the method comprises:
   a. obtaining images of the manufacturing environment collected over a time series by a visible light camera;
   b. for each utility, obtaining utility meter data collected over the time series from a smart energy meter that measures usage of said utility, wherein the utility meter data is a time series history of the aggregate power consumption of the manufacturing environment;
   c. obtaining a temperature data, from the temperature sensor, of the manufacturing environment collected over the time series; and
   d. correlating the images, the temperature data and utility meter data in order to:
      i. classifying a workflow activity of a worker and energy consumption of a machine in the manufacturing environment;
      ii. determining a status of the workflow activity and a status of the machine usage in real time;
      iii. identifying sources of potential inefficiencies or leakages in the workflow activity and energy consumption based at least in part on the workflow assessment; and
      iv. implementing improvements to workflow activity and machine usage corresponding to the identified sources, thereby optimizing workflows and energy efficiency.

2. The method of claim 1, wherein the utilities comprise electricity, water, and gas.

3. The method of claim 1, wherein the images are used to detect the worker in the scene with histogram of oriented gradients (HOG) descriptor and measure machine occupancy present in the manufacturing environment.

4. The method of claim 1, wherein the images comprise a frame capture of the worker.

5. The method of claim 1, wherein body movement information is extracted from the image capture to form a classification of machine usage activated by the worker, which serves as a trigger event for syncing with utility meter data.

6. The method of claim 5, wherein information from the images is pre-processed using Open Computer Vision (OpenCV).

7. The method of claim 1, wherein the utility meter data is obtained through a network.

8. The method of claim 1, wherein the visible light camera is operatively connected to single-board computer, which is used for preprocessing to classify the workflow and machine activities.

9. The method of claim 1 further comprising obtaining the temperature data of the manufacturing environment collected over the time series by the sensor to confirm the classification of workflow activity of the worker and energy consumption of the machine in the manufacturing environment, wherein the sensor is an infrared camera, thermometer, or thermocouple.

10. The method of claim 9, wherein temperature data is obtained from an infrared camera by using a temperature-controller load source and calibrating the mapping temperature at each pixel from raw IR images.

11. The method of claim 1, wherein time series comprises a plurality of times separated by 2 to 10 second intervals.

12. A non-intrusive method for assessing and optimizing a manufacturing environment, wherein the manufacturing environment employs a plurality of utilities, wherein the method is carried out by instructions stored on a non-transient computer-readable medium and executed by a processor, wherein the method comprises:
   a. obtaining images of the manufacturing environment collected over a plurality of times by a visible light camera;
   b. for each utility, obtaining utility meter data collected over the plurality of times from a smart energy meter that measures usage of said utility;
   c. correlating the images and utility meter data in order to:
      i. classify a workflow activity of a worker and energy consumption of a machine in the manufacturing environment; and
      ii. determine a status of the workflow activity and a status of the machine usage in real time, thereby generating a workflow assessment;
   d. identifying sources of potential inefficiencies or leakages in the workflow activity and energy consumption based at least in part on the workflow assessment; and
   e. implementing improvements to workflow activity and machine usage corresponding to the identified sources, thereby optimizing workflows and energy efficiency.

13. A non-intrusive system for monitoring a manufacturing environment, wherein the manufacturing environment employs a plurality of utilities, wherein the system comprises:
a. a communications network;
b. a visible light camera operatively coupled to the communications network;
c. for each utility, a smart energy meter that measures usage of said utility, wherein the smart energy meter is operatively coupled to the communications network;
d. a processor operatively coupled to the communications network; and
e. a memory operatively coupled to the processor, said memory storing instructions that, when executed by the processor, causes the processor to perform operations comprising:
i. obtaining images of the manufacturing environment collected over a time series by the visible light camera;
ii. for each utility, obtaining utility meter data collected over the time series from the smart energy meter;
iii. correlating the images and utility meter data;
iv. classifying a workflow activity of a worker and energy consumption of a machine in the manufacturing environment based on the correlation;
v. determining a status of the workflow activity and a status of the machine usage based on the correlation in real time;
vi. identifying sources of potential inefficiencies or leakages in the workflow activity and energy consumption based at least in part on the workflow assessment; and
vii. implementing improvements to workflow activity and machine usage corresponding to the identified sources, thereby optimizing workflows and energy efficiency.

14. The system of claim 13, wherein the memory stores additional instructions for optimizing the manufacturing environment, said instructions causing the processor to perform operations comprising:
a. identifying sources of potential inefficiencies or leakages in the workflow activity and energy consumption based at least in part on the workflow assessment; and
b. suggesting improvements to workflow activity and machine usage corresponding to the identified sources.

15. The system of claim 13, wherein the plurality of utilities comprise electricity, water, and gas.

16. The system of claim 13, wherein the images comprise a frame capture of the worker.

17. The system of claim 13, wherein body movement information is extracted from the images to form a classification of machine usage activated by the worker, which serves as a trigger event for syncing with utility meter data.

18. The system of claim 13 further comprising a temperature sensor operatively coupled to the communications network for obtaining a temperature data of the manufacturing environment collected over the time series to confirm the classification of workflow activity of the worker and energy consumption of the machine in the manufacturing environment, wherein the temperature sensor is an infrared camera, thermometer, or thermocouple.

19. The system of claim 18, wherein the temperature data is obtained from an infrared camera by using a temperature-controller load source and calibrating the mapping temperature at each pixel from raw IR images.

20. The system of claim 13, wherein time series comprises a plurality of times separated by 2 to 10 second intervals.

* * * * *